US005101116A

United States Patent [19]

Morokawa

[11] Patent Number: 5,101,116

[45] Date of Patent: Mar. 31, 1992

[54] MULTI-LEVEL VOLTAGE GENERATOR TO DRIVE LCD

[75] Inventor: Shigeru Morokawa, Higashiyamato, Japan

[73] Assignee: Citizen Watch Co., Ltd., Tokyo, Japan

[21] Appl. No.: 513,276

[22] Filed: Apr. 24, 1990

[30] Foreign Application Priority Data

Apr. 25, 1989 [JP] Japan ................................ 1-105235

[51] Int. Cl.[5] ............................................ H03K 3/01

[52] U.S. Cl. .................................. 307/264; 307/261; 359/85; 340/805; 340/811

[58] Field of Search ..................... 307/264, 261, 260; 350/332, 333; 340/805, 811

[56] References Cited

U.S. PATENT DOCUMENTS 4,123,671 10/1978 Aihara et al. ...................... 307/264
4,843,252 6/1989 Morokawa et al. ............... 307/264
4,893,117 1/1990 Blomley et al. .................... 350/333

FOREIGN PATENT DOCUMENTS 2161012 1/1986 United Kingdom .

*Primary Examiner*—Stanley D. Miller
*Assistant Examiner*—Toan Tran
*Attorney, Agent, or Firm*—Finnegan, Henderson, Farabow, Garrett and Dunner

[57] ABSTRACT

A display drive circuit including a pulse generator means; a variable voltage source circuit including a first voltage source line ($VD_t$) with a variable potential, a second voltage source line ($VS_t$) with a potential different from the first voltage source line by a constant value, having a voltage waveform, a variation period and a variation component the same as the first voltage source line, and varying in potential with a potential level not more than the lowest potential level of the first voltage source line, and other voltage source lines with constant potential levels between the potentials of the first and second voltage source lines; and an integrated circuit having an electronic switch which switches at a constant period the connection of the voltage source lines so as to make a plurality of constant waveform voltages, outputting these to a plurality of output terminals at constant phase difference.

5 Claims, 6 Drawing Sheets

MULTI-LEVEL VOLTAGE GENERATOR TO DRIVE LCD

BACKGROUND OF THE INVENTION

1. Field of the Invention

The present invention relates to a drive circuit for a display driven by an alternating current (AC), more particularly relates to a drive circuit for an electroluminescence (EL) display device and a liquid crystal display device including a plurality of passive addressing type and active addressing type liquid crystal pixels arranged in a matrix form, further particularly relates to a construction of an integrated circuit for driving a common timing electrode and a construction of a drive circuit using the same.

2. Description of the Related Art

There are many electrical components and devices which are driven by AC power. The voltage necessary to drive those is obtained by transforming commercial voltage utilizing a transformer.

When the frequency of the necessary voltage differs from the commercial voltage, the necessary voltage has been obtained by first preparing and amplifying an AC drive waveform from a direct current (DC) voltage utilizing a semiconductor device and then adjusting the voltage level by adjusting the DC voltage, wave form, or winding ratio of the transformer.

On the other hand, in order to actually obtain a display driving wave voltage generating circuit having a small volume and light weight, the waveform and the voltage can be controlled by a circuit using semiconductor devices.

In this case, the DC voltage of the voltage generating circuit must be more than $\sqrt{2}$ times the effective value of the driving AC voltage required. In order to obtain a high AC voltage, there is the push-pull drive method.

Two voltage generating circuits having AC amplitudes of opposite polarity are prepared, and a drive voltage of a maximum two times that of the source voltage can be generated by driving the devices utilizing the difference between the two voltages.

In this circuit, a DC voltage component in the push-pull drive method can be canceled out by utilizing two voltage waveforms having the same polarity and the same amplitude.

When a plurality of devices are intended to be driven, the devices are arranged in a matrix form and driven utilizing the push-pull drive principle.

Note, that in this system, the devices are classified into several groups.

One end of a device belonging to one group is driven by a timing signal with a waveform defined by a function of a time a constant period.

Another end is driven by a drive waveform of the opposite or same polarity as the timing signal in response to whether the drive for the devices is ON or OFF.

One example of such a driving method is disclosed in the Journal of the Society of Information Display, Vol. 26/1, 1985, page 9 to 15.

According to this drive method, an AC voltage having higher voltage level than the DC voltage can be applied across the terminals of a device, although a semiconductor switching device having a high withstand voltage is required to drive high voltage drive devices.

On the other hand, a matrix type drive system is usually used for a displaying apparatus because the numbers of displaying pixels thereof are generally large.

An integrated circuit consisting of transistors and having multiple output terminals can be used for driving liquid crystal or EL type display means.

However, when high integration density is required, the display means must be driven with a low voltage; when a high withstand voltage must be realized, a low integration density is required; and when a high processing speed should be realized, the display means must be driven with a low voltage.

It is very difficult to make an integrated circuit satisfying all of the above requirements simultaneously.

Generally, in designing a complementary field effect transistor integrated circuit (C/MOS-IC), the source voltage is set at 5 V.

When designing for a source voltage of more than 5 V, the integration density of the circuit remarkably falls and the operating speed of the IC declines.

For example, when the IC is driven by 5 V, the response speed is about 50 MHz, while when driven by 25 V, the response speed is about 5 MHz and the integration density is $\frac{1}{4}$ of the former one.

The insufficient operating speed resulted in it being thought difficult to obtain a fine image display in a liquid crystal display device.

One method for solving this is to design those parts of an IC requiring a quick response to operate at 5 V, to add a logic level converting circuit that greatly amplifies the logic amplitude, and to connect parts driven by a large amplitude to the IC circuit in a high withstand voltage design to satisfy the dual requirements of high speed operation and high withstand voltage.

The construction above, however, requires provision in the IC for many level shifters, which , in turn, require either enlarging the IC chip or reducing the functions included in one IC chip, thus resulting in an extremely uneconomical IC.

The present inventor has already proposed an idea for improving this in Japanese Unexamined Patent Publication (Kokai) No. 60-249191.

According to the proposal, a pulse signal having a differential voltage exceeding the source voltage can be obtained by adding up a first pulse signal generated from a pulse generating circuit, and a second pulse signal having a different voltage level obtained from the first pulse signal, utilizing a clamping circuit.

There are limitations in usage of this method, however, since the pulse signals which can be used are restricted to those where the low voltage level of the first pulse signal and the high voltage level of the second pulse signal are close to each other.

The object of the present invention is to overcome the drawbacks in the conventional circuits and to provide a circuit which utilizes a semiconductor IC having relatively low withstand voltage to produce a drive waveform of a regular high voltage which exceeds the withstand voltage.

SUMMARY OF THE PRESENT INVENTION

To attain this object, there is provided a display drive circuit which includes a constant period pulse generating means; a variable voltage source circuit including a first voltage source line ($VD_t$) with a variable potential, a second voltage source line ($VS_t$) with a potential different from the first voltage source line by constant value, having a voltage waveform, a variation period, and a variation component the same as the first voltage source line, and varying in potential with a potential level not more than the lowest potential level of the first voltage source line, and a third, fourth (VM+, VM−) and more voltage source lines with constant potential levels between the potentials of the first and second voltage source lines; and an IC having an electronic switching means which switches at a constant period the connection of the voltage source lines so as to make a plurality of constant waveform voltages, outputting those to a plurality of output terminals at a constant phase difference.

That is, the present invention provides a new construction drive circuit provided with a constant voltage source having a constant differential voltage, a potential varied against the ground level, and constant voltage source lines with potentials not varied against the ground level, these being used to drive an IC and produce a drive voltage having a voltage level against the ground exceeding the operational source voltage of the IC.

The constant voltage source can easily be formed in the IC by clamping the output voltage of the pulse generating circuit at a constant voltage source circuit utilizing a diode or transistor through a capacitor.

The driving output voltage wave is formed by combining a voltage waveform based on the low potential of the source line inside the IC and a potential varying against the ground level of a low potential source line of the IC.

DESCRIPTION OF THE PREFERRED EMBODIMENTS

Specific embodiments of the present invention will now be explained with reference to attached drawings.

Figure 1A:
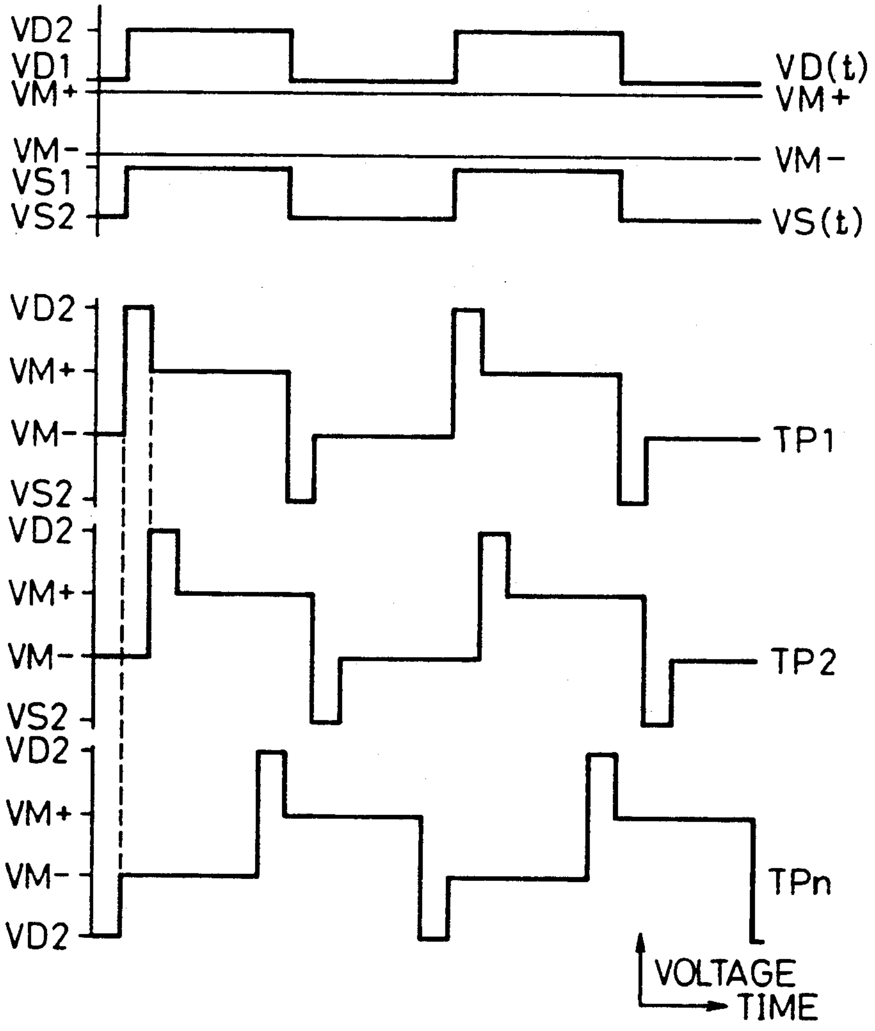
FIG. 1A is a diagram of a combined voltage waveform in the variable voltage source circuit of the present invention.

FIG. 1A shows the relationship of the potentials of the variable voltage source of the present invention and the output voltages to the ground potential level. $VD_t$ denotes a terminal voltage of a positive polarity side of the variable voltage source, $VS_t$ denotes a terminal voltage of a negative polarity side of the variable voltage source, and VM+ and VM− denote terminal voltages of an intermediate voltage source of the positive polarity side and an intermediate voltage source of the negative polarity side, respectively. TP1, TP2 . . . TPn denote timing voltage waveforms.

The operational source voltage of the IC, $V_{ic}$, is given by following equation;

$$V_{ic}=[VD_t-VS_t]$$

Accordingly, the operational source voltage of the IC, $V_{ic}$, is less than the output differential voltage represented by the following equation:

$$[VD2-VS2]$$

The ratio is about ⅔ to ½.

The potentials $VD_t$ and $VS_t$ appear to vary with respect to the ground voltage level as a reference.

It is not usually required that the operating voltage of the IC be always constant, although in order to prevent erroneous operation and to reduce the possibility of noise, it is preferable that sudden changes of the source voltage in a short time be avoided.

Figure 1B:
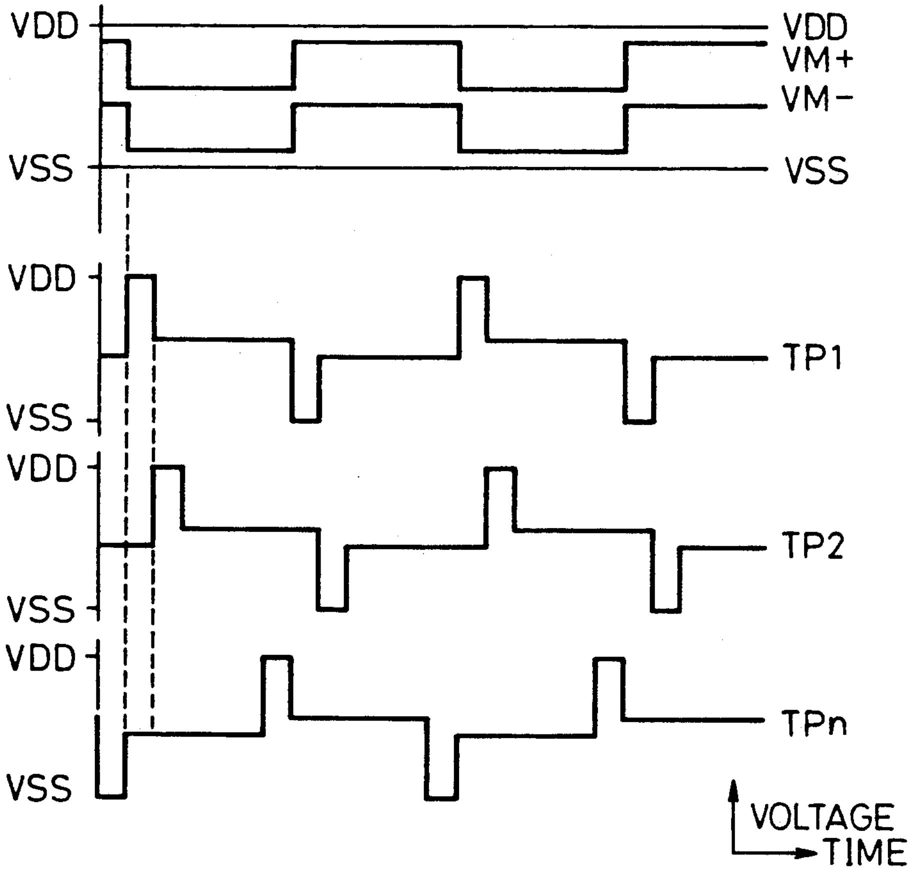
FIG. 1B is a diagram of one example of a waveform of a potential inside an IC of the circuit of the present invention.

FIG. 1B shows the relationship between voltages generated in the IC of the present invention. In FIG. 1B, the voltages indicated with respect to the ground level as a reference in FIG. 1A are represented as VDD and VSS with respect to the voltage $VS_t$ as a reference. Therefore, the operational source voltage inside the IC corresponds to such a constant DC voltage.

The voltage system as shown in FIG. 1A can easily be obtained by preparing a pulse voltage source and a DC voltage source and by combining the two voltages utilizing pulse clamping circuits.

Figure 2A:
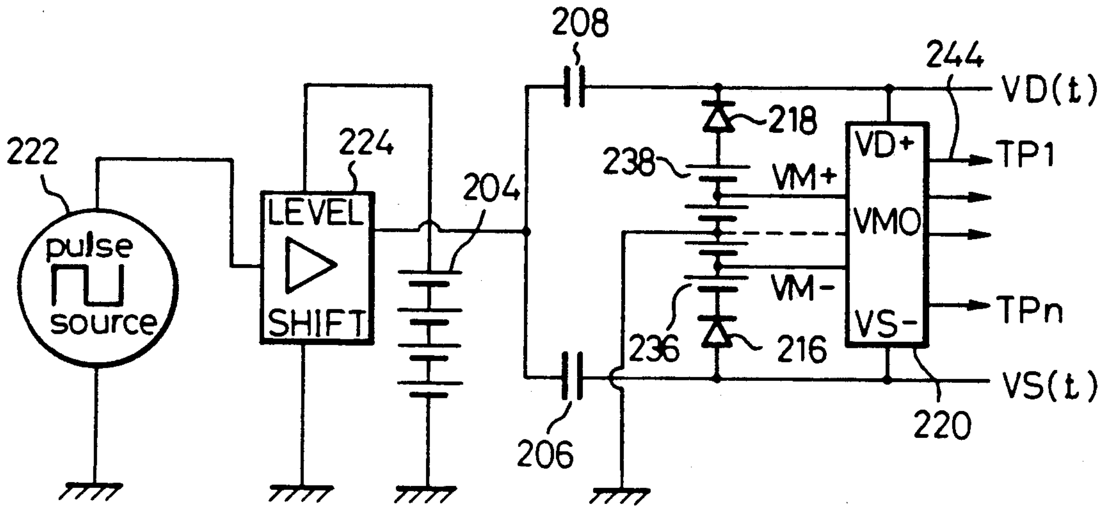
FIGS. 2A, 2B, and 2C are block diagrams of a circuit provided with a variable voltage source including a clamping circuit.
Figure 2B:
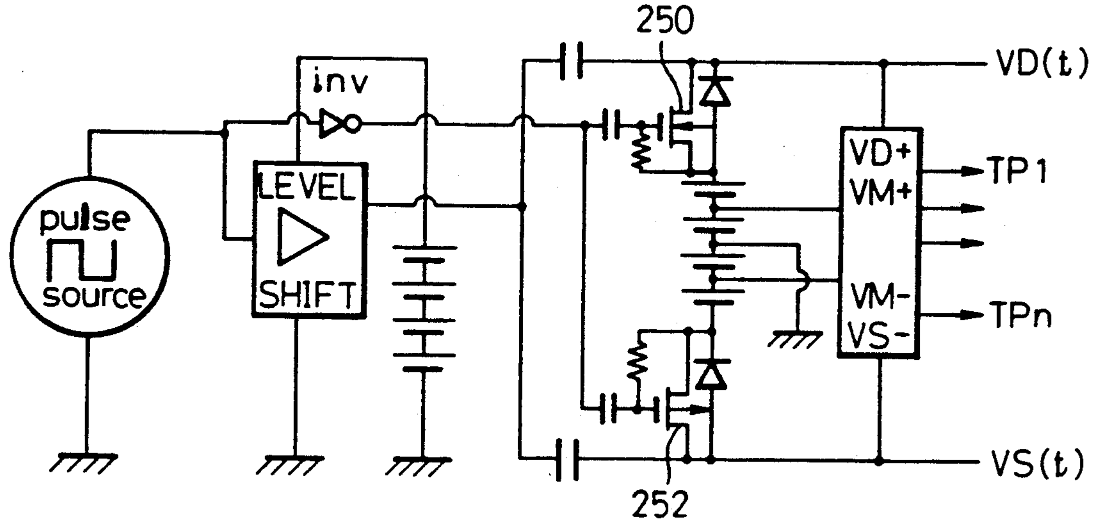
Figure 2C:
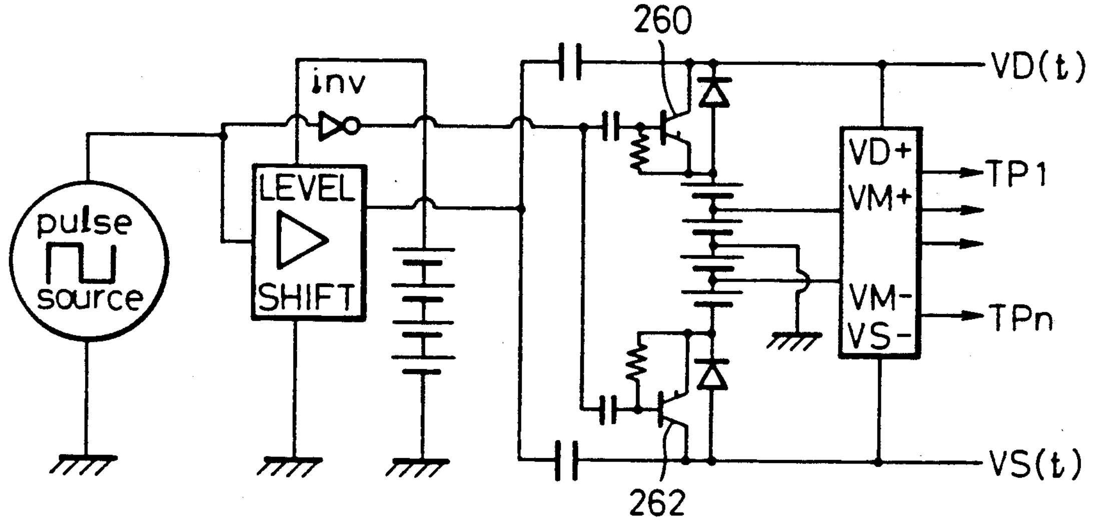
Figure 3:
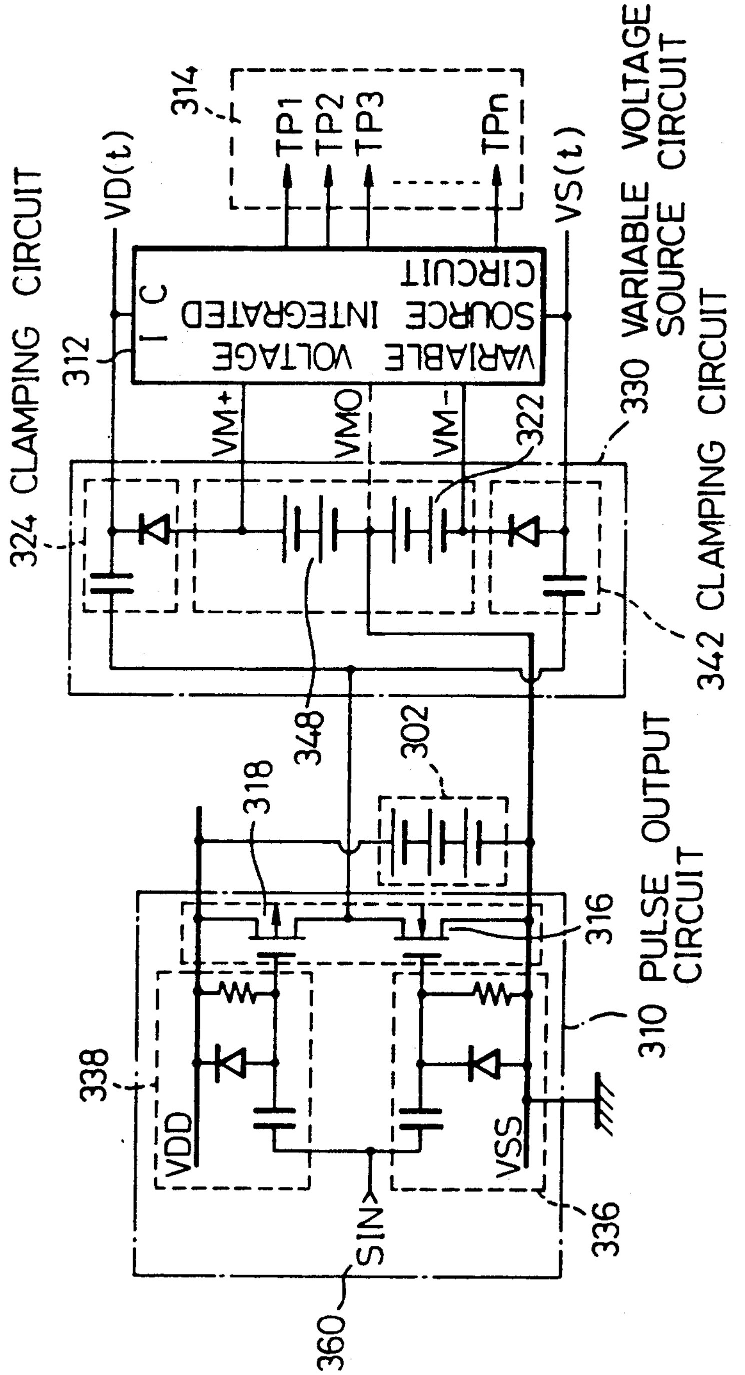
FIG. 3 is a block diagram of a level shifting circuit of the present invention.

FIGS. 2A, 2B, and 2C show the functional construction for combining the voltages, and FIG. 3 shows a specific embodiment of a drive circuit having a variable voltage source circuit.

FIG. 2A shows a specific embodiment of a construction of the variable voltage source of the present invention. DC voltage sources 204, 236, and 238, a drive IC 220, a pulse generating means 222, capacitors 208, and 206, and diodes 216, and 218 are provided therein.

The clamping circuit for the positive potential electrode of the voltage source 238 includes a capacitor 208 and a diode 218, while the clamping circuit for the negative potential electrode of the voltage source 236 includes a capacitor 206 and a diode 216.

An amplifing circuit 224 is also provided, which circuit 224 has a low impedance and commonly serves as a drive voltage source for the IC 220.

The low level side voltage of the pulse voltage waveform of the pulse output from the amplifying circuit 224 is clamped by the clamping circuit including the capacitor 208 and the diode 218 to give an output voltage $VD_t$ to the positive voltage of the DC voltage source 238.

On the other hand, the high level side voltage of the pulse voltage waveform of the pulse is clamped by the clamping circuit including the capacitor 206 and the diode 216 to give an output voltage $VS_t$ to the negative voltage of the direct current voltage source 236.

Accordingly, a total voltage which includes the output voltage of the amplifying circuit 224 and the output voltage of the voltage sources 236 and 238, is applied to the IC 220.

When a voltage drop occurs in the diodes 216 and 218 used in the clamping circuit and a switching device used in the amplifing circuit 224, the total voltage will fall slightly corresponding to the voltage drop. Thus, when a field effect transistor is connected in parallel to the diode, the voltage drop in the forward direction of the diode can be prevented, leading to an improved clamping efficiency. In the same way, a bipolar transistor may be connected in parallel to the diode instead of the field effect transistor.

FIG. 2B shows an embodiment of the present invention in which field effect transistors 250 and 252 are connected to the respective diodes in parallel FIG. 2C shows another embodiment in which bipolar transistors 260 and 262 are connected to the diodes in a parallel form. Both embodiments prevent the forward voltage drop of the diodes.

FIG. 3 shows an embodiment of the variable voltage source, and in the figure there are shown DC voltage sources 302, 322 and 348, a pulse generating circuit 310, a liquid crystal driving IC 312 driven by the variable voltage source, and a liquid crystal display device 314.

A variable voltage source 330 for driving the liquid crystal driving IC 312 is also provided. This includes voltage sources 322 and 348 and clamping circuits 324 and 342 having low impedances.

On the other hand, N-channel and P-channel field effect transistors 316 and 318 are provided to form a complementary inverter circuit having a low impedance and to serve as an amplifying circuit for amplifying the pulse.

In the inverter circuit, level shift clamping circuits 336 and 338 are provided at the input gates in order to realize a high power and low loss operation of the circuit, whereby generation of a through current, which occurs when a pulse having a large amplitude is generated from a pulse having a small amplitude, is suppressed.

The N-channel and the P-channel field effect transistors in the embodiment may be replaced with NPN and PNP bipolar transistors respectively.

A clamping circuit 336 is provided to match a low level side voltage of an input signal $S_{in}$ 360 with the level of the negative electrode of the voltage source 302, while a clamping circuit 338 is provided to match a high level side voltage of an input signal $S_{in}$ 360 with the level of the positive electrode of the voltage source 302.

On the other hand, clamping circuits 342 and 324 are provided to match a high level side voltage of the pulse signal having a large amplitude and low impedance with the level of the negative electrode of the voltage source 322 and a low level side voltage of the pulse with the level of the positive electrode of the voltage source 348, respectively.

Therefore, in these clamping circuits, a capacitor with relatively large capacitance and a diode enabling passage of a relatively large current, are used.

Accordingly, the maximum high level voltage $VD_t$ and minimum low level voltage $VS_t$ of the variable voltage source are applied to the positive side substrate voltage and the negative side substrate voltage of the IC 312, respectively.

Constant voltages VM+ and VM−, each of an intermediate level between the voltages $VD_t$ and $VS_t$, are applied to the IC 312 simultaneously. Further, a plurality of constant voltages other than the constant voltages VM+ and VM− but each intermediate between the voltages VM+ and VM− may be applied simultaneously.

In this case, just a ground level voltage $VM_O$, i.e., an intermediate level between the constant voltages VM+ and VM−, may also be applied.

When these output voltages as mentioned above are represented utilizing the voltage level $VS_t$ as a reference voltage (VSS), they may be represented by the waveforms shown in FIG. 1B. As apparent from FIG. 1B, a voltage VDD-VSS ($=V_{iC}$) is applied to a portion between the positive and negative electrodes of the voltage source substrate and $$V_{iC}=VD_t-VS_t=\text{constant}.$$

Observing the intermediate voltages VM+ and VM− utilizing the voltage level VSS as a reference, variable intermediate voltages VM+ and VM− are simultaneously applied to the IC circuit 312.

When the voltage drop in the clamping circuit is zero, the total voltage obtained by adding the output voltage VB1 of the voltage source 302 and the output voltage VB2 of the voltage source 322 (voltage source 348 shows the same voltage), i.e., VB1+2.VB2, is applied to the IC. Therefore, the resultant differential output voltage of the IC is represented as shown in FIGS. 1A and 1B and also represented as following equation;

$$2\cdot[VB1+VB2].$$

If necessary, a plurality of other voltage levels each of an arbitrary level within the variable voltage defined by VM+ and VM− may be provided in this embodiment, so complicated drive waveforms each having four different kinds of voltage levels including two or more constant intermediate voltages can be easily obtained.

These voltage levels can be substituted with a voltage of a level which varies in a pulse form as long as the pulse like voltage level falls into an area between the voltages of $VD_t$ and $VS_t$. VM+ and VM− and also voltages $VDM_t$ and $VSM_t$, each waveform varying as a function of time, may be set. The resultant voltage can be output from a plurality of output terminals with a constant timing but with a predetermined phase difference utilizing a suitable switching means for switching the output terminals in turn.

Figure 4:
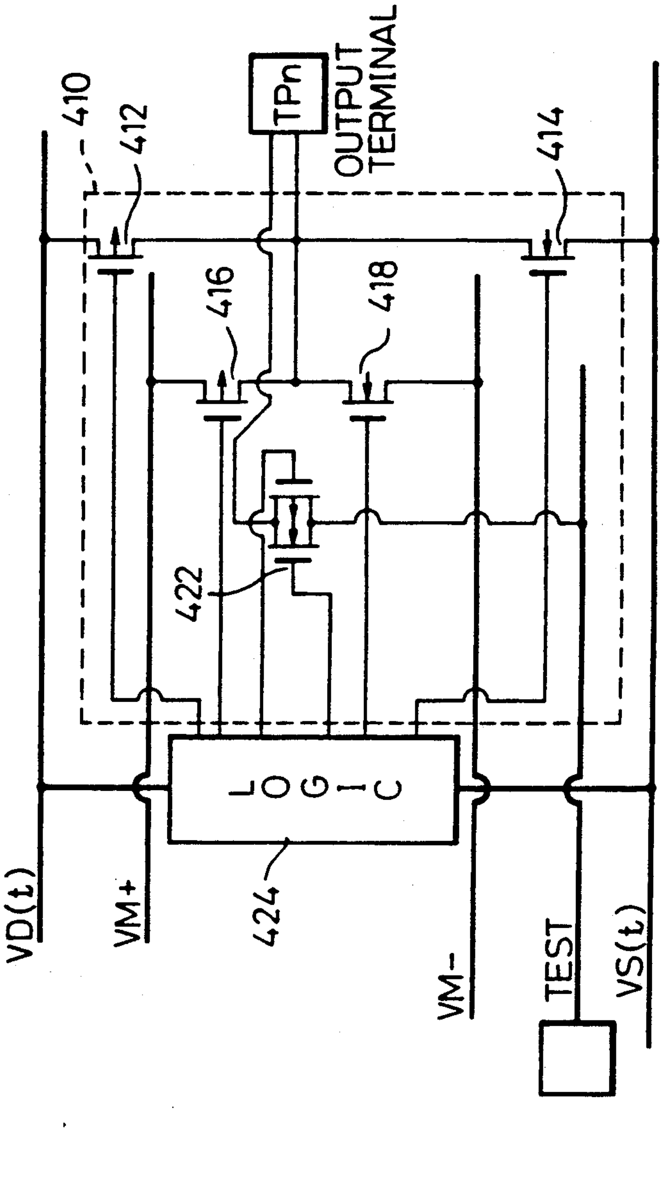
FIG. 4 is a block diagram of a specific construction of an IC combining drive waveforms of the present invention.

FIG. 4 shows an embodiment of a construction of the liquid crystal drive IC circuit 312 shown in FIG. 3. In this embodiment, a logic circuit 424 for adding the plurality of the drive signals and an output circuit 410 for adding the driving output signals in response to the signal output from the logic circuit 424 are provided.

The output circuit 410, which serves as a switching circuit, is provided with switching transistors for determining an output voltage by sequentially selecting a voltage out of the plurality of source voltages, for example, $VD_t$, VM+, VM−, and $VS_t$, each supplied thereto, by a switching device and bringing the voltage thus selected to one of the output terminals in turn, whereby an output pulse signal having a plurality of different voltage levels which is generated as a function of time, as shown in FIGS. 1A and 1B, can be obtained.

A P-channel field effect transistor 412 for connecting the maximum voltage $VD_t$ of the liquid crystal drive IC to one output terminal thereof and an N-channel field effect transistor 414 for connecting the minimum voltage $VS_t$ of the liquid crystal driving IC to the output terminal thereof are provided.

On the other hand, a pair of transistors 416 and 418 are also provided to form a complementary transmission gate circuit for connecting the intermediate voltages VM+ and VM− to the output terminal.

In order to drive the switching circuit 410, when a logic amplitude voltage of the logic circuit is set at a high level not less than the output voltage of the switching circuit, the driving efficiency thereof is improved due to the voltage drop in the switching circuit being reduced.

Also, a transmission gate 422 for a test is provided. Any of the output terminals thereof is connected to a common line TEST through the switching device 422. When a test for the voltage level of the line TEST is required, it may be measured in accordance with need, or a test signal can be first input to the logic circuit 424 to set a certain voltage level, and when the test is carried out, the output terminals are arbitrary and selectively connected to the line TEST, whereby existence of a short-circuit current is determined.

Therefore it is possible to carry out the test for a plurality of the output terminals of the IC in a short time and with high accuracy.

This line TEST can be used so that, for example, when the IC is driven, the voltage level thereof is set at a certain constant voltage level or variable level to supplementally modulate the output voltage.

As explained above, in accordance with the present invention, a high voltage drive signal higher than the withstand voltage of the power source of the IC can be easily obtained, and a display drive IC having high integration density enabling high speed data transmission can be obtained utilizing an IC produced by a standard processing step with low cost.

I claim:

1. A display drive circuit, comprising:

a pulse source for outputting a pulse train;

a variable voltage source circuit means connected to the pulse source, said variable voltage source circuit means having a first voltage line for conducting a highest potential relative to ground level, having a second voltage line for conducting a lowest potential relative to ground level, and having at least one intermediate voltage line for conducting potential between the first and second voltage line potentials, said variable voltage source circuit means being responsive to the pulse train for varying the voltage between the first and second voltage line potentials, a difference value between the first and second voltage line potentials being constant; and an integrated circuit, connected to the first voltage line, the second voltage line, and the at least one intermediate voltage line for outputting on an output line multi-level stable waveform drive signals, said integrated circuit having electronic switching means for selectively changing connections between the first, second, and the at least one intermediate voltage line with said output line, resulting in said waveform drive signals having a peak to peak potential difference greater than the difference value between the first and second voltage line potentials at a fixed repetition period and a fixed phase difference.

2. A display drive circuit according to claim 1, wherein the at least one intermediate voltage line comprises a third intermediate voltage line and a fourth intermediate voltage line; wherein the integrated circuit comprises a positive substrate connected to the first voltage line;

a negative substrate connected to the second voltage line;

a complementary field effect transistor circuit including a P-channel field effect transistor having a source and drain, said source being connected to the third intermediate voltage line, an N-channel field effect transistor having a source and drain, said source being connected to the fourth intermediate voltage line, the fourth intermediate voltage line having a potential value below that of the third intermediate voltage line; and wherein said output line is connected to the drain of said P-channel field effect transistor and the drain of said N-channel field effect transistor for outputting said output waveform drive signals.

3. A display drive circuit according to claim 1, wherein the variable voltage source circuit means comprises:

a first fixed potential direct current voltage source having the highest potential connected to the first voltage line;

a second fixed potential direct current voltage source having the lowest potential connected to the second voltage line;

an intermediate fixed potential direct current voltage source having a potential between the highest and lowest potentials connected to the at least one intermediate voltage line; and a clamping circuit, including a capacitor and a semiconductor switching device, connected to at least one of the first and second voltage lines for clamping a potential of a pulse signal from the pulse source means to a potential of the corresponding fixed potential direct current voltage source.

4. A display drive circuit according to claim 3, wherein said switching device used in said clamping circuit is selected from the group consisting of a diode, a field effect transistor, and a bipolar transistor.

5. A display drive circuit according to claim 3, wherein said switching device used in said clamping circuit comprises a diode and a transistor arranged in parallel.

* * * * *